United States Patent [19]
Fertig

[11] Patent Number: 5,716,442
[45] Date of Patent: Feb. 10, 1998

[54] LIGHT PIPE WITH SOLAR BULB ENERGY CONVERSION SYSTEM

[76] Inventor: Robert T. Fertig, 182 Bible St., Cos Cob., Conn. 06807

[21] Appl. No.: 625,099

[22] Filed: Apr. 1, 1996

Related U.S. Application Data

[63] Continuation-in-part of Ser. No. 437,028, May 26, 1995, abandoned.

[51] Int. Cl.[6] .................... H01L 31/052; H01L 31/048
[52] U.S. Cl. ................ 136/246; 136/251; 136/259; 136/291; 136/293; 250/227.11; 250/227.32; 320/2; 359/597; 362/257; 385/125; 385/900
[58] Field of Search ..................... 136/246, 251, 136/259, 291, 293; 362/257; 385/900, 125; 320/2; 359/597; 250/227.11, 227.32

[56] References Cited

U.S. PATENT DOCUMENTS

| | | | |
|---|---|---|---|
| 3,317,738 | 5/1967 | Piepenbrink et al. | 250/227.11 |
| 4,131,485 | 12/1978 | Meinel et al. | 136/259 |
| 4,166,917 | 9/1979 | Dorfeld et al. | 136/259 |
| 4,177,083 | 12/1979 | Kennedy | 136/259 |
| 4,529,830 | 7/1985 | Daniel | 136/246 |
| 4,574,161 | 3/1986 | Marks | 136/263 |
| 4,918,357 | 4/1990 | Waterbury | 315/87 |
| 5,229,624 | 7/1993 | Marks | 257/40 |
| 5,500,054 | 3/1996 | Goldstein | 136/253 |

*Primary Examiner*—Aaron Weisstuch

[57] ABSTRACT

A light pipe with Solar Bulb energy conservation system that includes: one or more solar and/or artificial light sources; one or more opaque and/or transparent hollow tubular conduits; a reflective material means covering the inside surfaces of the hollow tubular conduits; a mirror at either end of the conduits and between any vertical and horizontal connecting joint sections; a plurality of photovoltaic cell arrays mounted on substrates, positioned inside the hollow tubular conduits, whereby part of the light energy source illuminates, and part of the light energy source is converted into electric energy. The light pipe system optionally includes: an exterior transparent protective dome and reflector; a light concentrator means; a battery charge controller; a rechargeable battery or plurality of batteries; a DC to AC inverter; an AC/DC light ballast, with a battery charge switch; and single or multiple light fixtures, that include conventional bulbs, and/or Power Saver Bulbs, and/or Solar Bulbs. The Solar Bulb converts sunlight or artificial light to electric energy, by photovoltaic means. The Power Saver Bulb illuminates and converts artificial light to electric energy, by photovoltaic means.

13 Claims, 10 Drawing Sheets

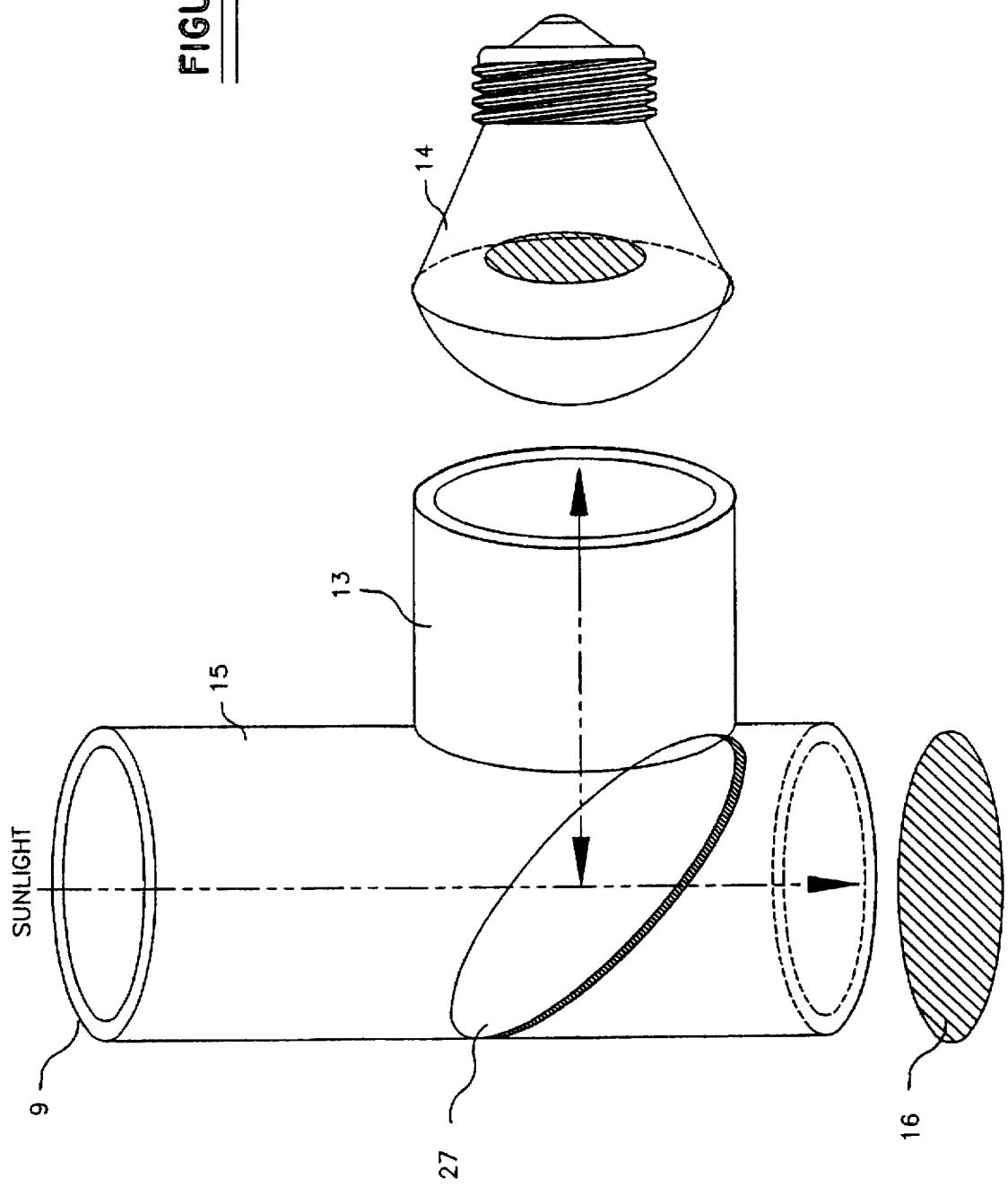

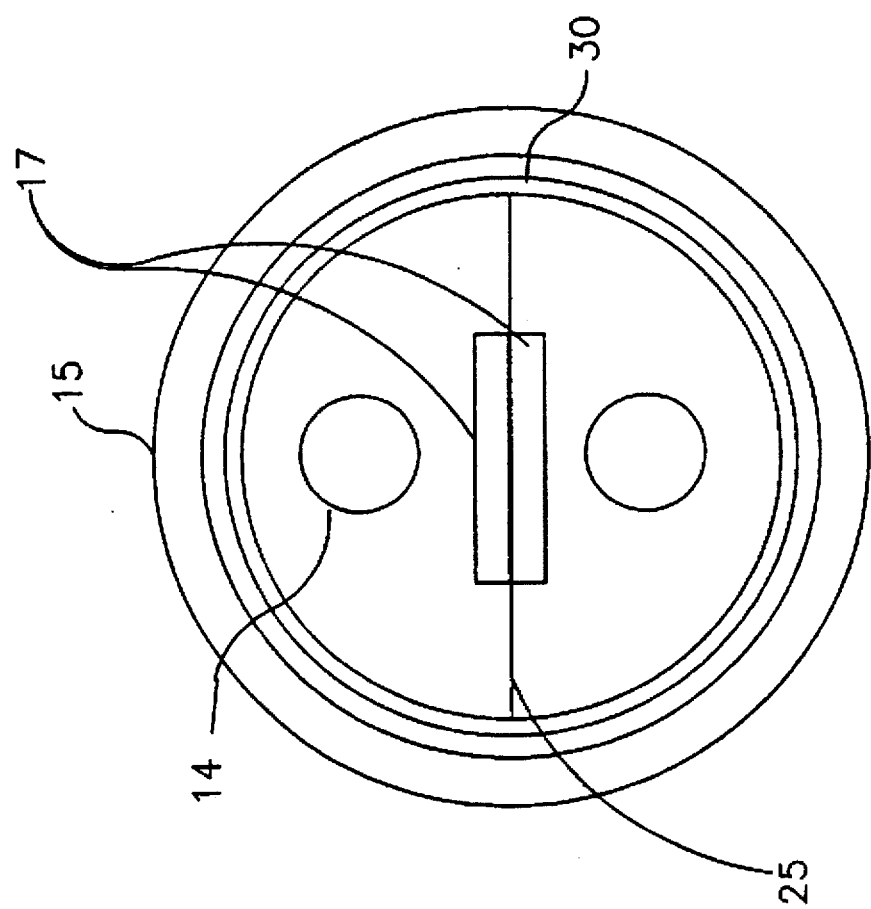

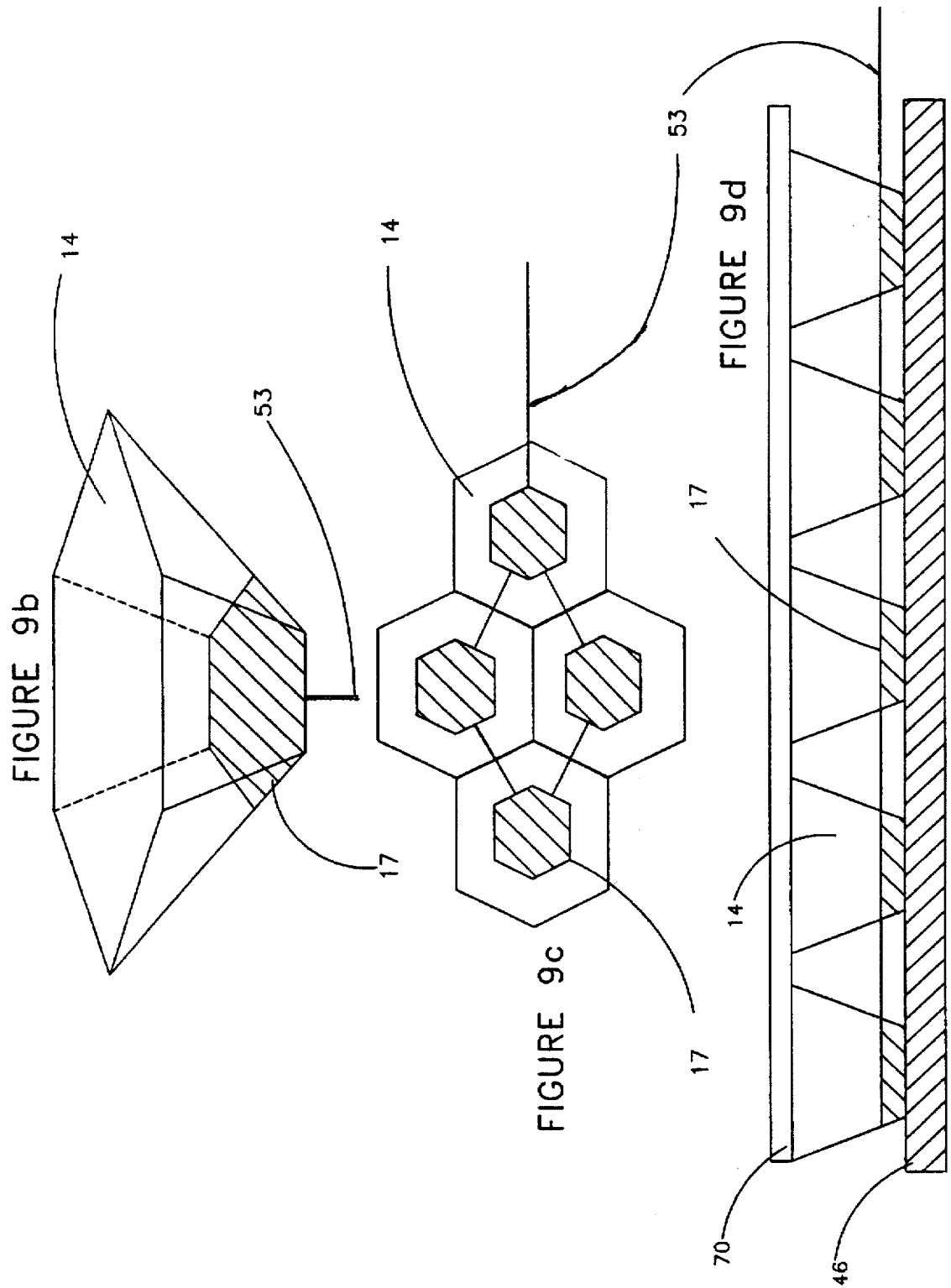

FIGURE 10a
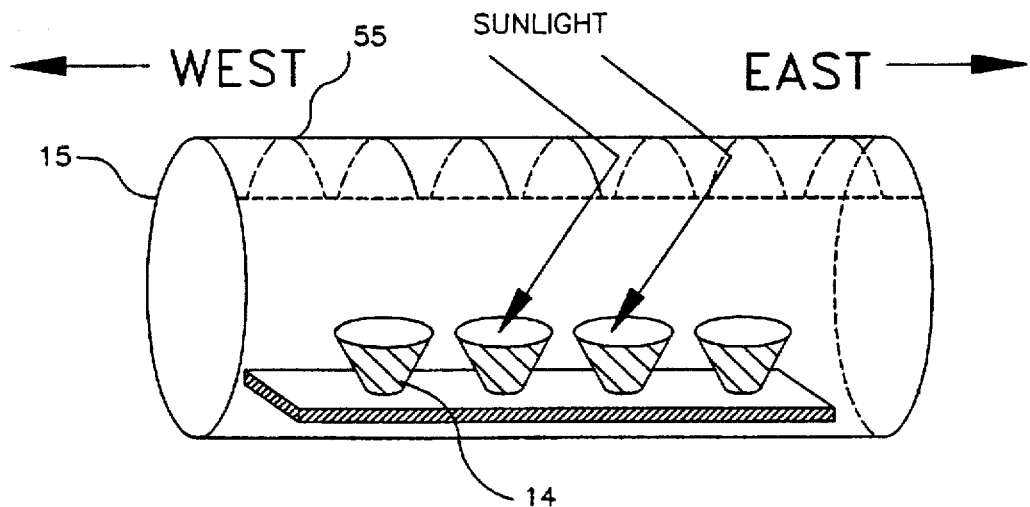
FIGURE 10b
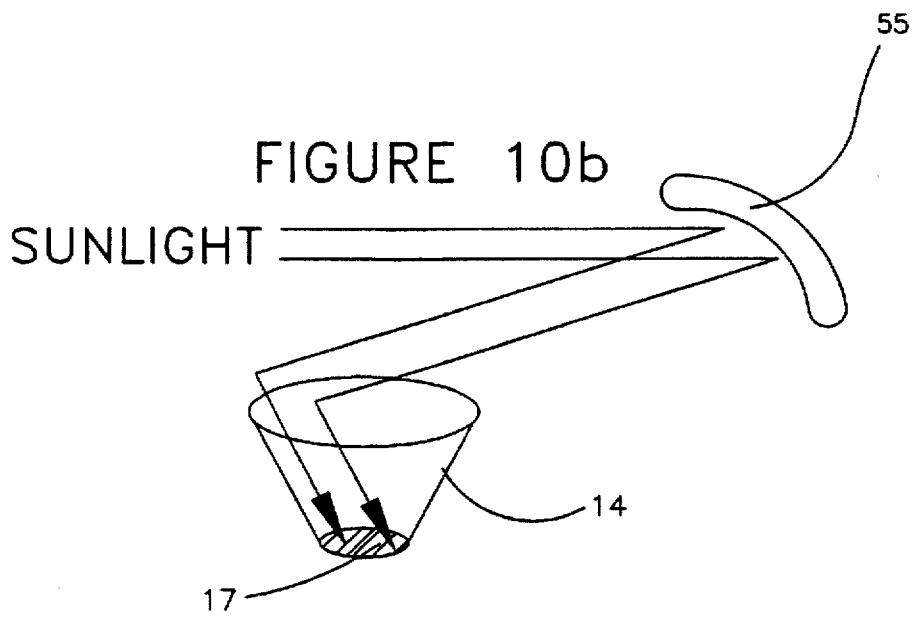
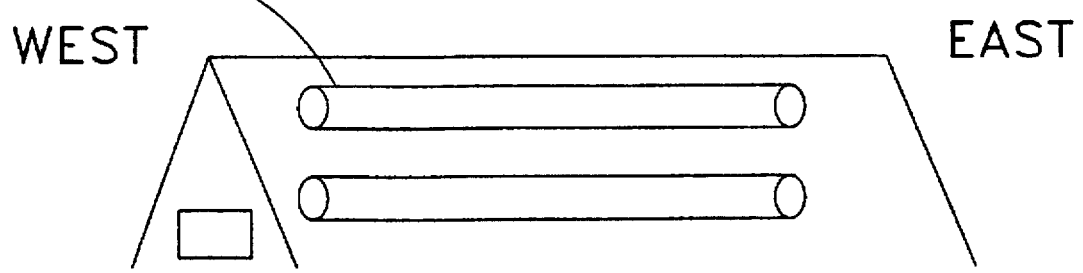
FIGURE 10c

LIGHT PIPE WITH SOLAR BULB ENERGY CONVERSION SYSTEM

CROSS-REFERENCES TO RELATED APPLICATIONS

This is a continuation-in-part of application No. 08/437,028 filed May 26, 1995, now abandoned.

BACKGROUND—FIELD OF THE INVENTION

The present invention relates to the collection, concentration, and conversion of sunlight and/or artificial light energy for producing electric energy, by photovoltaics means, in Light Pipes and Solar Bulbs (TM), illumination, storage of DC electric energy in batteries, conversion to AC, and distribution thereof for electrical applications.

BACKGROUND—DESCRIPTION OF PRIOR ART

Conventionally, photovoltaics (also known as solar cells) have been applied to exterior surfaces because the sun provides 930 watts of "free" energy per 10.57 square feet of surface area, at sea level, on a sunny day. Limitations for exterior applications include: peak conversion efficiency is only about 20%; the angle of the photovoltaics panels in relation to the sun is critical; the solar panels are very costly to install, and must cover a large roof or other surface area; and the expensive photovoltaic panels are exposed to adverse weather conditions, which shortens their useful life and/or requires costly repairs. In summary, the peak electric energy produced by exterior uses of photovoltaics varies significantly, depending on the season, time of day, exact positioning, and weather conditions.

Fundamentally, if the cost of an invention exceeds the expected benefits, then it is not economically practical. The cost trends for photovoltaics, also known as solar cell arrays or panels, has declined from about $10 per watt in the 1980's, to approximately $4 to $5 per watt, in 1996. Industry forecasts expect the cost of solar technology to decline to less than $1 per watt, by 1999. For example, a new solar cell device, "Light-Polarizing, Electrically-Conducting Film," also known by the trade mark "Lumeloid," by Dr. Alvin Marks, U.S. Pat. No. 5,229,624, issued in Jul. 20, 1993, is estimated to cost about $0.50 per watt, when produced in volume. Therefore, if the total cost of all the required components of a light to electric energy conversion system exceeds the cost of adding additional solar cells, then it is not economically practical for consumers.

Skylight systems, such as disclosed in U.S. Pat. No. 5,099,622, the disclosure of which is hereby incorporated by reference, are costly to install and less efficient in transporting light because they use more expensive, highly-polished, reflective metal tube conduits, which are only about 85% to 95% efficient in transporting light within the hollow conduits. As a result, a light beam could lose about 5% to 15% of its energy with each bounce down the inside walls of the reflective metal tubular conduits, thus seriously limiting configuration flexibility, and also limiting the maximum length of the conduit. In addition, searches of the prior art have not revealed any examples of Skylight systems that have also incorporated photovoltaics within said lighting systems.

The present invention utilizes 3M Optical Lighting Film, that surrounds all the inside walls of hollow tubular conduits, which is up to 99.9% efficient in transporting light. As a result, standard, inexpensive hollow tubular conduits, sold by plumbing suppliers (hereafter called "Light Pipes"), can be used as the housing for the 3M Optical Lighting Film (Trade Mark). Light Pipes can also utilize ordinary L-shaped plumbing couplers, to connect vertical and horizontal tubular conduit sections together, with a mirror or other reflective material positioned inside the couplings, thus enabling the piping of sunlight and/or artificial light into almost any area, thereby avoiding many exterior and interior obstacles in the installation.

Interior applications of solar cells or photovoltaics, such as disclosed in U.S. Pat. Nos. 4,374,406; 4,379,324; 4,568,521; 4,816,970; 4,974,126; and 4,918,357, the disclosures of which are hereby incorporated by reference, have important limitations including: they block or absorb a substantial part of the light emissions from the lighting fixtures, thus limiting the range of practical lighting applications; and the small size photovoltaics used produces very low output electric energy, thereby restricting the scope and type of practical applications.

In 1978 Manelas, U.S. Pat. No. 4,080,221, the disclosure of which is hereby incorporated by reference, the object is to also utilize the heat absorbed by truncated-conical, light-collector shells, and avoid shadow areas within the shells, during certain times of day, caused by the changing position of the sun light. The result produced sufficient electric energy; however, it required mechanical positioning, and the overall system is complex. Therefore reliability and cost justification for the performance achieved remains elusive.

Piepenbrick, U.S. Pat. No. 3,317,738, issued May 2, 1967, the disclosure of which is hereby incorporated by reference. This invention is fundamentally a scanning device that uses a cylindrical light rod (not a hollow light pipe, as the current invention), made of light-conducting material, a rotating drum, and a photo-sensitive receiver. Said scanner is not designed for, and indeed cannot operate as a light energy to electric energy conversion device, as is the current invention. Furthermore, said device design is limited to using a fluorescent light rod, and the solar cells must be placed at the ends of the light rods. In contrast, the current invention uses hollow light pipes, can use many different light sources, including sunlight, and solar cells can be placed almost anywhere within the hollow light pipes. This ancient prior art lacks any suggestion that the reference invention could be modified, and was never implemented in a manner required to meet the claims in the current invention. Applicant's invention solves a different problem than the reference, and such different problem is recited in the claims. In re Wright, 6 USPQ 2d 1959 (1988).

Meinel, U.S. Pat. No. 4,131,485, issued December 1978, the disclosure of which is hereby incorporated by reference. This invention does not use hollow light pipes, and does not use artificial light sources, requires a complex mechanical solar positioning device and heat exchanger, and Fresnel-like lens design, which adds substantial complexity and cost, as compared to the current invention. This ancient prior art lacks any suggestion that the reference invention could be modified, and was never implemented in a manner required to meet the claims stated in the current invention.

Dorfield, U.S. Pat. No. 4,166,917, issued Sep. 4, 1979, the disclosure of which is hereby incorporated by reference. This invention is not a cone shaped device, and does not use hollow light pipes, or artificial light sources. As a result, the Dorfeld bulb will cause sunlight to be blocked (due to the light concentrator wall shadows), at different sun angles, thus reducing its efficiency substantially. In addition, a mechanical positioning mechanism is required to track the sun, which adds substantial complexity and cost, as compared to the current invention. The current invention is made simpler, without loss of capability. This ancient prior art lacks any suggestion that the reference invention could be modified, and was never implemented in a manner required to meet the claims in the current invention.

Kennedy, U.S. Pat. No. 4,177,083, issued December 1979, the disclosure of which is hereby incorporated by reference, is conceptually similar, but very different in implementation, in regards to one element of the current invention, the Solar Bulb component. The Solar Bulb component of the current invention includes a unique top surface reflector design, that enables sunlight to enter the bulb, at different angles, without any need for a mechanical solar positioning device. Kennedy also does not use hollow light pipes, or artificial light sources, and requires a mechanical solar positioning device, which adds substantial complexity and cost. The current invention is made simpler, without loss of capability, thereby improving efficiency and substantially reducing cost.

Daniel, U.S. Pat. No. 4,529,830, issued Jul. 16, 1985, the disclosure of which is hereby incorporated by reference. This invention is essentially a single beam lens system, using multiple Fresnel lens, Pyramidal mirrors, optical fibers (not hollow light pipes), and a heat distribution element, which is more complex, more costly, and less reliable than the current invention, which does not require said components. The current invention is made simpler, without loss of capability, thereby improving efficiency and substantially reducing cost.

Waterbury, U.S. Pat. No. 4,918,357, issued Apr. 17, 1990, the disclosure of which is hereby incorporated by reference. This invention does not use a solar light source, and requires a special (none standard) AC/DC filament light bulb. In addition, the special incandescent bulb is not of the same type, shape and design as the current invention (Solar Bulb), and the bulb filament is below the solar cells, which creates substantial heat, thus substantially reducing solar cell life and efficiency. The placement of the solar cells around the top of the bulb substantially reduces lumens output, and produces very low electric power output, as compared to the current invention. Moreover, if the placement of solar cells below the light bulb filament was obvious, it was never implemented, and the invention produced inferior results. For these reasons, this invention has not been generally accepted in the marketplace. In contrast, the current invention uses standard bulbs of different types, shapes, and sizes (power ratings), without blocking light output, or creating excessive heat on the solar cells, thereby improving efficiency and substantially reducing cost.

Goldstein, U.S. Pat. No. 5,500,054, issued Mar. 19, 1996, the disclosure of which is hereby incorporated by reference. This invention requires the use of complex, expensive, and difficult to manufacture, superemissive materials (nuclear decay materials, radioactive isotopes, and other thermo energy sources), to produce the light source. Goldstein requires a wave guide, fiber optical cables or special glass rods, and does not use hollow light pipes, as the current invention. The current invention uses standard bulbs of different types, shapes, and sizes (power ratings), and sunlight, without loss of capability, thereby improving efficiency and substantially reducing cost. Moreover, the prior art lacks any suggestion that the reference invention could be modified in a manner to meet the current claims, and was never implemented in to meet the claims stated in the current invention.

The present invention proposes a much broader, flexible, and not fully appreciated application of photovoltaics; that is, using both sunlight and/or artificial light in Light Pipes, novel Solar Bulbs (Trade Mark) and Power Saver Bulbs, for saving substantial electric energy in offices, factories, and wherever sufficient light energy exists. This application of photovoltaics inside Light Pipes, Solar Bulbs and Power Saver Bulbs avoids the above cited limitations and disadvantages, and alternatively provides emergency electric energy from conventional batteries, should the electric utility power be disrupted. In addition, sealed Light Pipes, Solar Bulbs and Power Saver Bulbs eliminate dust, moisture and reduce ultraviolet exposure, which represents a problem with many lighting systems in a wide variety of applications that require clean room operation, or in very dirty operating environments.

The present invention involves the collection, concentration, conversion, storage and controlled usage (including illumination) of the exterior sunlight energy source available on surfaces such as roofs, and/or any interior artificial lighting energy, thereby providing: savings in fossil fuel usage; a substantial reduction in environmental pollution; availability of standby emergency backup power, especially in remote regions that do not have easy access to public utilities; longer equipment installation life; reduced maintenance costs; and lower cost per kilowatt hour of electric usage, while also reducing ultraviolet exposure. The above are some of the objects of the current invention.

SUMMARY OF THE INVENTION

According to the present invention, light from a source comprising natural sunlight, and/or artificial light sources, is piped into any area, using many different configurations of hollow tubular conduits, hereafter defined as "Light Pipes," having highly-reflective inside wall surfaces. Light pipes can be easily installed in any structure such as offices, factories, homes and many other facilities, thereby providing sufficient candle power to illuminate the work area, and enabling photovoltaic cell arrays, appropriately attached inside, to produce substantial electric energy to operate a wide range of electrical devices and appliances.

While light pipes are well known in the lighting art, they are usually restricted to only one type of light source, whereas the present invention enables a mixture of multiple light sources, including sunlight and many types of artificial light bulb sources, to be used in the same light pipes, thus giving the consumer a wider selection of lighting qualities, configurations, and economy. In addition, when the sun is not shining, or during cloudy days, the artificial light source can be activated in the light pipes.

Experiments have demonstrated that light energy supplied from sunlight, or very high lumens artificial light, can currently provide up to about 10 watts of peak electric energy per one square foot of photovoltaic cell array area or module size. Research has shown that properly designed light reflectors and concentrators, such as the novel reflector/concentrator design, Solar Bulb, and Power Saver Bulb embodiments of the present invention, can about triple the efficiency of photovoltaics in converting light to electric energy. The electric energy produced can then be used directly to operate many DC electric devices, or to keep fully charged a bank of batteries. Also, DC electricity can be converted to AC electricity, so that it may be used for many electrical applications, and/or for emergency lighting purposes.

Moreover, more advanced polycrystalline photovoltaic cells, produced by Solarex, and three-layered (triple-junction) amorphous silicon photovoltaic cells, produced by Uni-Solar, among others, are expected to be in production by the 1997 to 1998 time-frame, and they should approximately double the efficiency in convening light to electric energy per unit cost. Therefore, the economic savings from the current invention should substantially improve over time, especially as the cost of public electric utilities continues to increase in the U.S. and especially worldwide.

The present invention utilizes the fact that, in many lighting applications, users of conventional lighting systems find the radiated light to be too bright, or it produces unwanted ultraviolet, near infrared radiation, and/or unnatural light. Consumers typically desire only certain frequencies of light provided by the sun or emitted by the bulbs from their lighting systems. The light industry has responded by producing light bulbs that are coated with light absorbing or filtering substances, enabling a dimmer or softer light to be emitted. This means of blocking and filtering light results in a good portion of the total light energy emitted by the bulbs being wasted. In addition, many lighting fixture designs waste light energy because the reflectors, if any are included, are inefficient.

Experiments conducted, using prototypes of the current invention, have shown that polycrystalline photovoltaic cells absorb light energy at the near infrared end of the light spectrum, or about 650 nanometer wavelengths, whereas amorphous silicon photovoltaic cells generally absorb light energy at the ultraviolet and blue end of the light spectrum, or about 400 to 500 nanometer wavelengths. Therefore, a substantial part of the more desirable, visible light spectrum of approximately 500 to 650 nanometers is not absorbed by the photovoltaic cells, if they are attached to clear transparent substrates. The substrates are thereafter secured to the inside centers or sides of light pipes, so as to not block most of the flow of the visible light emissions therefrom. Also, conventional light beam splitters, prisms, or dichroic light filter splitters are alternatively used inside light pipes to split the light beam, and/or separate the unwanted ultraviolet or near infrared light, thereby passing on the more desirable part of the light beam spectrum for general area illumination.

Another important object of the current invention is the Solar Bulb (Trade Mark) embodiment, that produces, rather than consumes electric energy. The Solar Bulb uses conventional reflector light bulbs, such as ordinary PAR 38 or R 57 style and size bulbs, as the transparent glass housing, and replaces the filaments inside with thin flat, disc or wafer-shaped photovoltaic cell arrays. Any light source entering the glass lens at the top of the bulb is reflected down the highly reflective, cone-like shaped interior bulb surfaces, onto the photovoltaic wafers inside, thereby producing substantial electric energy. The Solar Bulb is also an important component of the Light Pipe System. Experiments have indicated that the novel Solar Bulb can approximately triple the efficiency of the photovoltaic wafers in converting any sufficient light source to electric energy, thereby providing substantial economic benefits. Another embodiment of the Solar Bulb, hereafter named a "Power Saver Bulb," to avoid confusion, includes the conventional filaments, but positions the photovoltaic wafer below the filament, so as to not block the light, and reducing heat on the wafer, thereby producing substantial DC electricity.

Further objects and advantages of the invention will become apparent from a consideration of the drawings and ensuing descriptions.

DESCRIPTION OF THE DRAWINGS

In the drawings some figures represent variations of applications of the invention:

FIG. 3 shows a side view of the present invention, where vertical light pipes have connecting horizontal light pipes, and a reflecting mirror or prism is included at the joint, and light bulbs are alternatively included;

FIG. 5 shows another cross sectional view of the present invention, where light bulbs are included, and photovoltaic cells attached to substrates are located in the center of the light pipe;

FIGS. 9b, 9c, 9d show a novel octagonal and round shaped Solar Bulbs (TM), a unique "beehive," and "muffin pan" housing configurations for the bulbs;

FIGS. 10a, b, c, show the Solar Bulb (Trade Mark) embodiment of the present invention, and side views of the light pipe housing, and how a plurality of Solar Bulbs (TM) are attached to a roof surface.

DETAILED DESCRIPTION OF THE INVENTION

Figure 1:
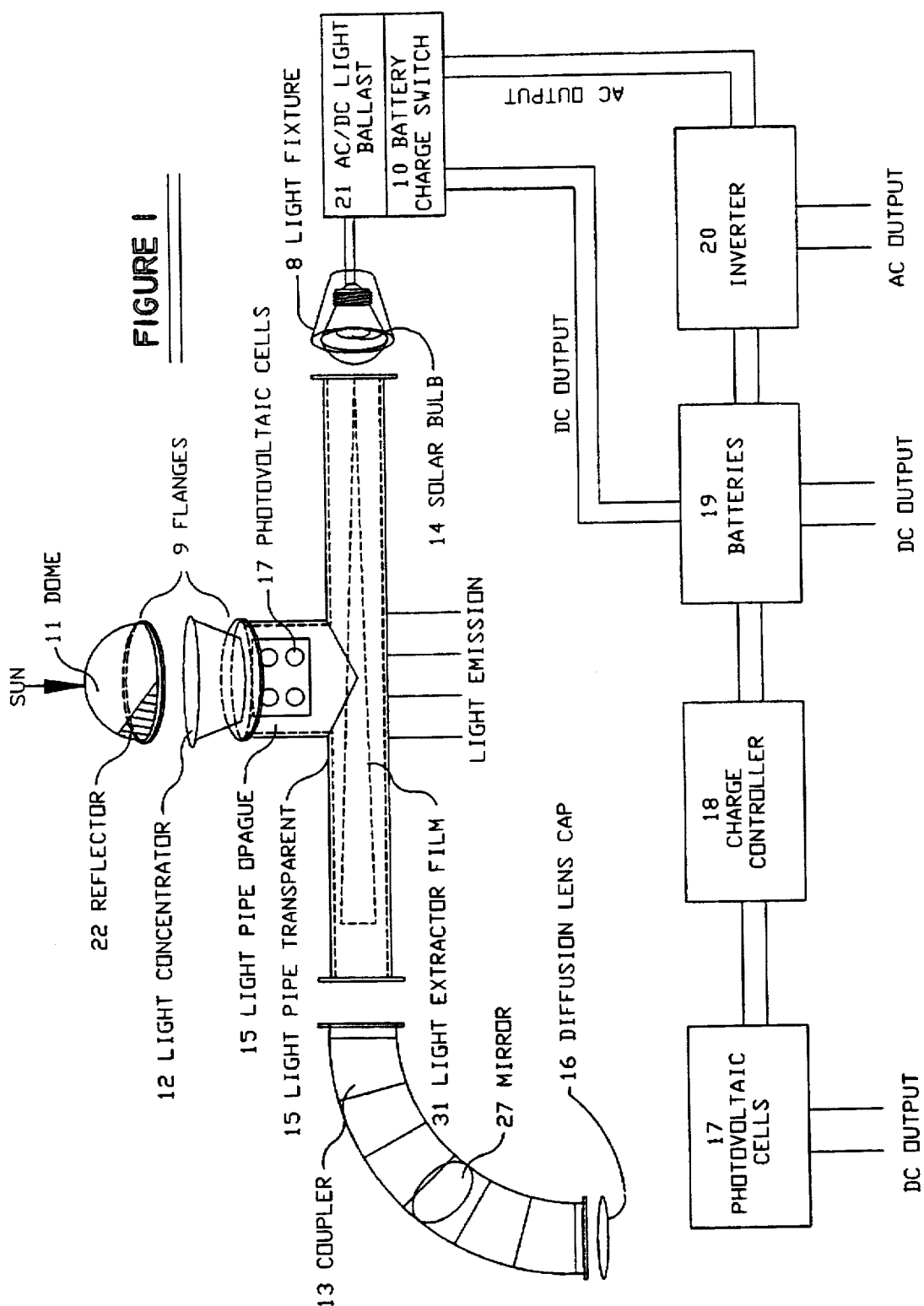
FIG. 1 is a schematic perspective view and system flowchart of the present invention, including the attachment of commercially available system components used to build a light pipe system.

Referring to FIG. 1 of the drawings, which illustrates a schematic view of a light pipe system configuration of the current invention, sunlight radiating on a dome 11 is reflected by a reflector 22 inside dome 11 and into a light concentrator 12, causing the sunlight to be concentrated inside a light pipe 15 comprising of hollow tubular conduits, having highly-reflective interior surfaces. Alternatively, in addition to sunlight, one or more light fixtures 8 that include conventional light bulbs and an ordinary reflector, or a Power Saver Bulb (defined later), among other possible bulb types, causes artificial light to radiate inside light pipe 15. A coupler 13 connects all sections of light pipes 15 to each other, such as horizontal sections to vertical sections, if any are required for the particular lighting application. Inside coupler 13 is a mirror 27 or prism, or light splitter, that causes the light source from dome 11 and/or light fixture 8 to be transmitted to other sections of light pipes 15. The alternative light fixture 8, if required for the lighting application, is selected from the group comprising of metal halide, fluorescent, incandescent, halogen, mercury, sulfur, sodium, or Power Saver Bulb. Light is also emitted from light pipe 15 transparent walls, by a 3M Extractor Film 31 (Trade Mark) means.

Figure 2:
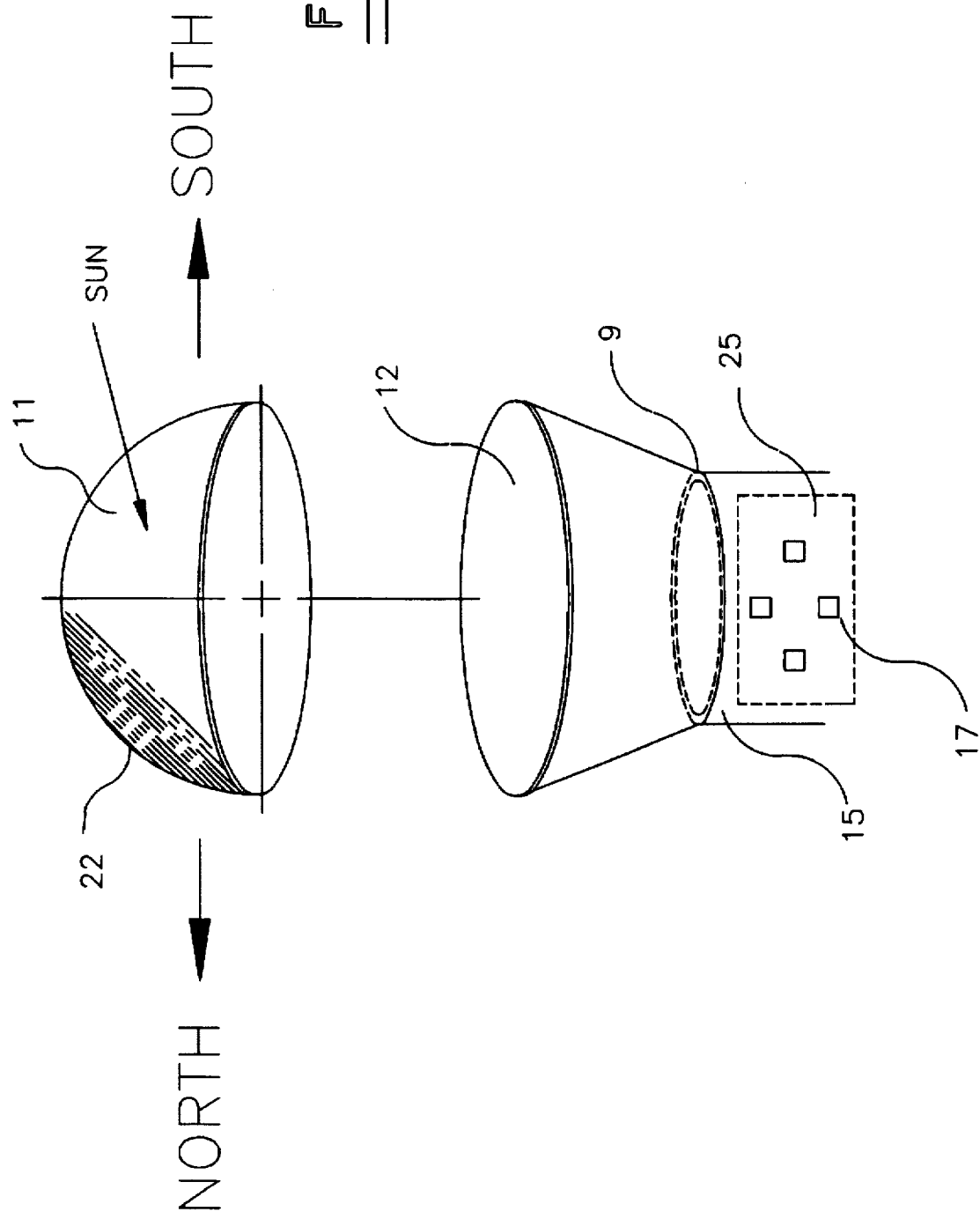
FIG. 2 shows a top view of an exterior dome and its reflector, and concentrator embodiment of the present invention, where a protective transparent dome and concentrator contains light reflective interior surfaces.

FIG. 2 shows that the plurality of photovoltaic cells 17 that convert light energy to electric energy, selected from the group comprising semicrystalline, polycrystalline and amorphous silicon, is positioned inside light pipe 15. The plurality of photovoltaic cells 17 are connected in series or in parallel, to achieve the desired DC output electric voltage and current, respectively, by conducting wire means. The positive side of photovoltaic cells 17 usually faces the light source, and the negative side is the back side.

FIG. 1 further shows that the DC output from the plurality of photovoltaic cells 17, by means of pairs of conducting wires, supplies DC electricity to the input electrical tabs of a charge controller 18, if required for the particular light pipe system application. Some lighting applications will use light pipes for illumination only, using sunlight and/or artificial light, without any photovoltaics or other components, or use the DC electricity directly to operate DC electrical devices, without any other lighting system components.

As FIG. 1 further indicates, charge controller 18 supplies DC electricity, by means of pairs of conducting wires, to a rechargeable battery 19 or plurality of batteries, of sufficient type and size, such as lead-acid types, among possible types, thereby charging batteries 19 and preventing them from being over-charged. Charge controller 18 customarily includes a conventional one-way Zener diode (not shown), thereby preventing electric current from draining from batteries 19 back into photovoltaic cell 17 arrays, when no light is available.

A plurality of batteries 19 is normally required for sufficient storage of electricity for most applications. Batteries 19 supply DC electricity to an inverter 20 of predetermined type and power, if required for AC electric applications, by means of pairs of conducting wires, which converts DC to AC electricity. The DC electricity output from batteries 19 is connected by means of pairs of conducting wires to the input side of a charge switch 10 customarily included inside a DC/AC light ballast 21 of predetermined type and power, such as commonly used in many emergency lighting applications.

Alternating current electricity from the output side of inverter 20 and from the public electric utility source, if available for the application, supplies AC electricity for the other input side of battery charge switch 10 by means of pairs of conducting wires. The DC and AC output side of battery charge switch 10, normally set in the DC position for economy, or set in the AC position for emergency backup applications, supplies AC or DC electricity to AC/DC light ballast 21 by means of pairs of conducting wires. AC/DC light ballast 21 is connected by means of pairs of conducting wires to light fixture 8 such as spot light fixture, among other possible types, that customarily includes some type of reflector. If no reflector is provided, a mirror-like reflective material is substituted for the reflector in light fixture 8.

Operationally, the light pipe system is conceptually similar, in some respects, to that cited in U.S. Pat. No. 4,080,221, the disclosure of which is hereby incorporated by reference. However, the implementation of the instant invention represents a substantial improvement. For example, as shown in FIG. 1, the plurality of photovoltaic cells 17 causes battery 19 or plurality of batteries, if required for the application, to be recharged under the control of charge controller 18. If the electric charge level of batteries 19 drops below the voltage and amps level required to power AC/DC ballast 21 and light fixture 8 battery charge switch 10 switches to the AC position, in order to continue to operate AC/DC ballast 21 and light fixture 8 until batteries 19 are fully charged again. When the batteries 19 are fully charged, battery charge switch 10 switches back to the DC position. For emergency or backup lighting applications, battery charge switch 10 is reversed; that is, set in the AC position, and thereafter switches to the DC position, whenever AC electric power from the utility source is disrupted. An example of conventional DC/AC light ballast 21 that includes battery charge switch 10 is the Bodine CB 90-12 model, among other ballast types used in emergency lighting applications.

FIG. 2 shows that whenever natural sunlight is required for the lighting application, dome 11, reflector 22, and light concentrator 12 are included in the configuration. Sunlight radiates through a hemi-spherical transparent dome 11 selected from the group comprising of acrylic, Plexiglas, tempered glass, Perspex (Trade Mark), or polycarbonate material, of predetermined diameter and depth, and at least $1/16$ inch in thickness. Dome 11 with reflector 22 and light concentrator 12 are positioned substantially vertically above the plane of exterior roof surfaces. The hemi-spherical dome 11 or upper bubble, includes inside light reflector 22 material selected from the group comprising substantially convex shaped polished metal, substantially convex shaped mirror, mirrored reflector film, or preferably 3M optical Lighting Film (Trade Mark), forming a substantially convex shaped reflective surface, attached by ordinary clamps and/or adhesive means.

Dome 11 and reflector 22 cause sunlight to be transmitted to light concentrator 12 of opaque material, selected from the group comprising acrylic, Plexiglas, metal, plastic, tempered-glass, or polycarbonate material, having a predetermined diameter and depth, and at least $1/16$ inch in thickness, extending vertically above exterior surfaces, such as a roof surface. All inside surfaces of light concentrator 12 have highly- reflective coating material, such as polished metal, or metalized plastic, or are lined with highly reflective 3M optical fighting film material, attached by ordinary clamps and/or adhesive means, whereby sunlight is directed into light pipe 15. Light pipe 15 has inside surfaces that are covered with a highly-reflective coating, such as polished metal, or metalized plastic, or are preferably lined with highly-reflective 3M optical lighting film material, attached if necessary by transparent adhesive tape means.

FIG. 2 further illustrates that preferably the plurality of photovoltaic cell 17 arrays are mounted on a single or a plurality of substrates 25 by adhesive means, and positioned inside light pipe 15 near the opaque end sections, and adjacent to the light source, by the transparent substrate 25 means, so as to not substantially block or interfere with transmission of the light beam through light pipe 15 transparent sections.

The at least one light pipe 15 has an inner surface and outer surface, and is selected from the group comprising a multiplicity of shapes, namely round, square, teardrop, half-moon, octagonal, hexagonal, or oval, and has a diameter of at least four inches, thickness of at least $1/16$ inch, and any predetermined length required for lighting applications. The at least one light pipe 15 having a wall member of opaque, partly opaque, transparent, or partly transparent materials, is selected from the group comprising tempered glass, acrylic, polycarbonate, Plexiglas, aluminum, metal, fiber, and plastic.

Dome 11 with its attached reflector 22 connects to substantially conical flared shell, or cone-like light concentrator 12 by means of flanges 9. The top larger opening of light concentrator 12 is about twice the diameter of the bottom smaller opening, and the height is about equal to the bottom diameter. The highly-reflective inside surfaces of reflector 22 and light concentrator 12, cause sunlight entering the top of dome 11 to be transported down vertical sections of light pipe 15.

The bottom section of light concentrator 12 is attached to a roof surface cavity area, cut out to be about the same bottom diameter as light concentrator 12 where it is joined together with the top vertical section of light pipe 15 and attached to each other by flanges 9 and by clamps, or screws and/or ordinary adhesive sealant means. Thus, the structure and attachment means prevents blockage by debris or snow, since light concentrator 12 and dome 11 are positioned parallel to the plane of the roof surface, and are substantially elevated above the roof cavity area. The clear transparent outside front of the protective solar dome 11 faces the southern direction, so as to receive maximum sunlight, which travels east to west.

The embodiment of the current invention, as illustrated in FIG. 2, is a substantial improvement over the sunlight reflectors and/or concentrators, as shown in U.S. Pat. Nos. 4,080,221 and 5,099,622, the disclosures of which are hereby incorporated by reference. The novel combination of dome 11 and reflector 22 and light concentrator 12 of the current invention, thereby provides substantially more natural sunlight, less solar heat, more flexible configuration choices and positioning options, and lower overall cost.

Referring to FIG. 3 of the drawings, shown are vertical and horizontal sections of light pipe 15 having a shape selected from the group comprising of round, square, oval, teardrop, or half-moon shaped, and predetermined diameter and length, and at least 1/16 inch in thickness. All light pipe 15 inside surface walls have thereon a highly-reflective coating, such as polished aluminum, anodized or metalized plastic film, or are preferably covered with 3M Optical Lighting Film (Trade Mark), made of acrylic or polycarbonate material, having a structured surface on the outside and smooth surface on the inside, as illustrated in U.S. Pat. Nos. 4,805,984 and 5,056,892, the disclosures of which are hereby incorporated by reference. Incident light from natural sunlight and/or artificial light sources, such as light fixture 8 bulb means, striking either of the inside surfaces of sections of light pipe 15 will be internally reflected at all other surfaces.

Still referring to FIG. 3 of the drawings, which is only one example of many possible configurations of light pipes 15 having one or more vertical and/or horizontal sections and/or partly vertical and partly horizontal sections of opaque and transparent, or partly opaque and partly transparent light pipes 15. Vertical and horizontal sections of light pipes 15 are connected to each other by inserting both end sections inside an ordinary Tee-shaped, or L-shaped coupler 13 means, such as the conventional type of couplers used by plumbers, that contain a screwing means and/or adhesive means.

FIG. 1 and FIG. 3 further illustrate that within the interior of the L-shaped coupler 13 that joins any vertical and horizontal light pipe 15 sections, there is a reflective mirror-like surface 27 such as a right-angle prism, or conventional mirror, or ordinary light beam splitter, or dichroic light beam splitter, having about the same inside diameter or width as coupler 13 attached by adhesive means, and positioned at predetermined position inside coupler 13. This light beam reflection or splitter means reflects part of the flight into other flight pipe 15 sections and/or transmits part of the light to the vertical section, and may alternatively include a diffusion lens cap 16 where part of the light emission egresses from light pipe 15, thereby substantially illuminating any area. One or more end sections of light pipe 15 alternatively includes additional light fixtures 8 with conventional bulbs, or Solar Bulbs 14, or Power Saver Bulbs (defined later). Light fixtures 8 can be attached at either end sections, or center sections of the flight pipe 15 by ordinary coupling, screw, and/or conventional clamping means. All light pipes 15 are preferably connected by threading means at all coupling connection points, thereby preventing dirt, dust, and moisture from entering therein, and light from escaping therefrom.

Figure 4:
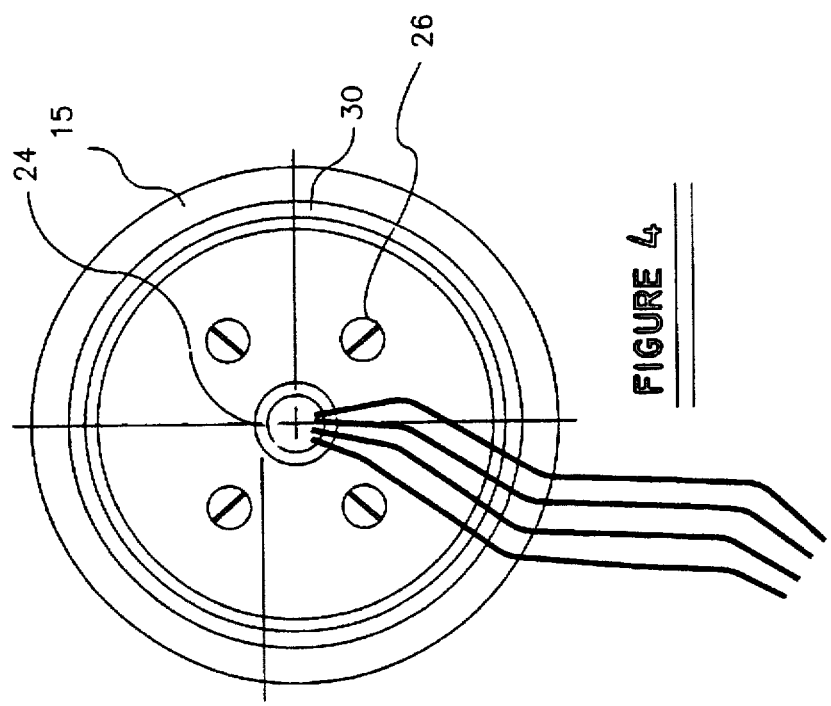
FIG. 4 shows an outside view of one end of a section of the light pipe, where a hole outlet is provided for the electric wires from a light fixture, and for the wires from the photovoltaic cell modules included therein, as well as screws that attach the light fixture.

FIG. 4 shows that an end cover 30 of light fixture 8 at either ends of light pipe 15 includes a round hole 24, of sufficient diameter for pairs of conducting wires to exit from the plurality of photovoltaic cells 17 (FIG. 2), and from light fixture 8 if included for the fighting application. Screw means 26 for the connection of light fixture 8 is also provided, if required. The round hole 24 is sealed by silicone sealant means, thereby preventing dirt, dust, and moisture from entering therein. All sections of light pipes 15 and fight fixtures 8 are preferably connected, one to the other, by conventional threaded coupling, whereby they may be disconnected for replacement of parts therein, and for normal maintenance thereof.

As FIG. 5 illustrates, the plurality of photovoltaic cells 17 are mounted on a single or plurality of substrates 25 of transparent tempered-glass, or clear acrylic, or clear quartz material of predetermined size, by adhesive means. Although substrate 25 can be attached to the inside wall of light pipe 15 by adhesive means, substrate 25 is preferably positioned in the inside center of light pipe 15. The width of substrate 25 in the latter case, is about equal to the inside diameter of light pipe 15, and thus is held in place without any adhesive means, so that substrate 25 can be removed for normal maintenance or replaced. The plurality of photovoltaic cells 17 should preferably be deposited on both sides of transparent substrate 25 material, in the manufacturing process, in order to maximize light passage through light pipe 15. Since this photovoltaic cell 17 array manufacturing process is not generally available, the current invention preferably uses the positioning arrangement and substrate 25 attachment means as previously illustrated.

Figure 6A:
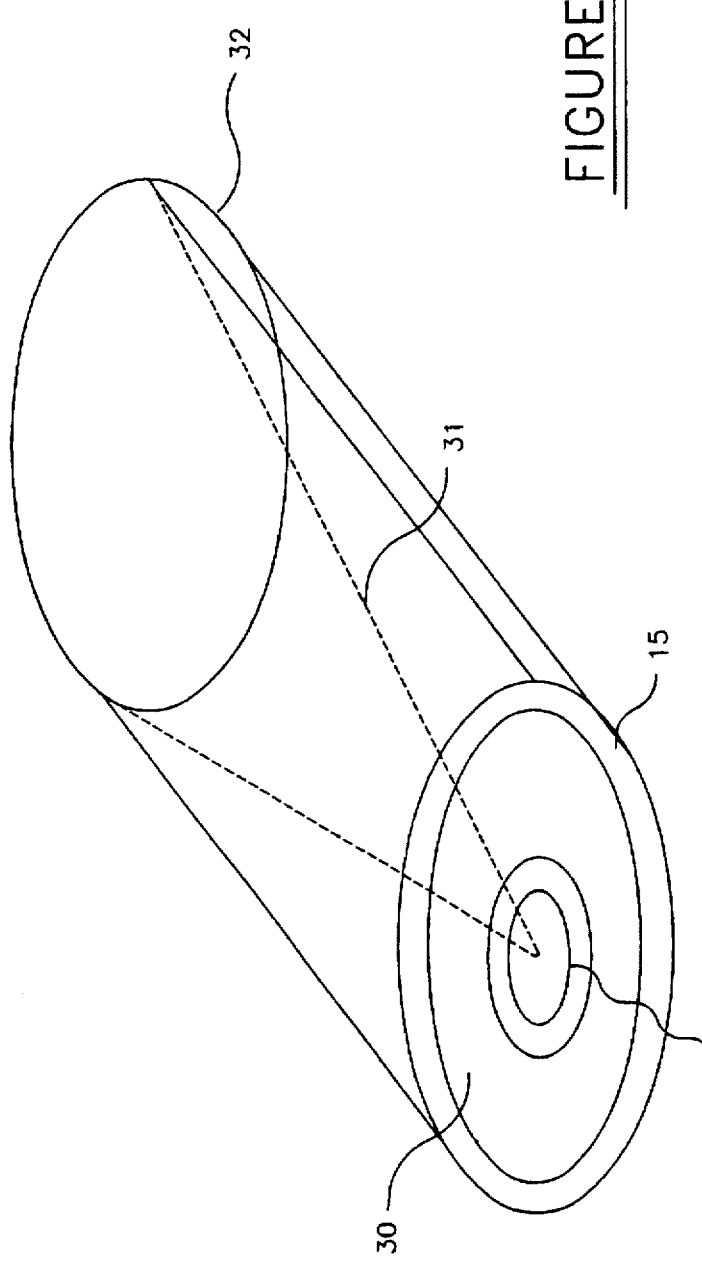
FIGS. 6a and 6b respectively show perspective and side views of one of the embodiments of the present invention, where an artificial light source, such as a spot light with its reflector, is attached to one end, and a mirror-like reflective surface is attached at the other end and joint, and where the light emission is controlled by the 3M Extractor Film inside the light pipes.
Figure 6B:
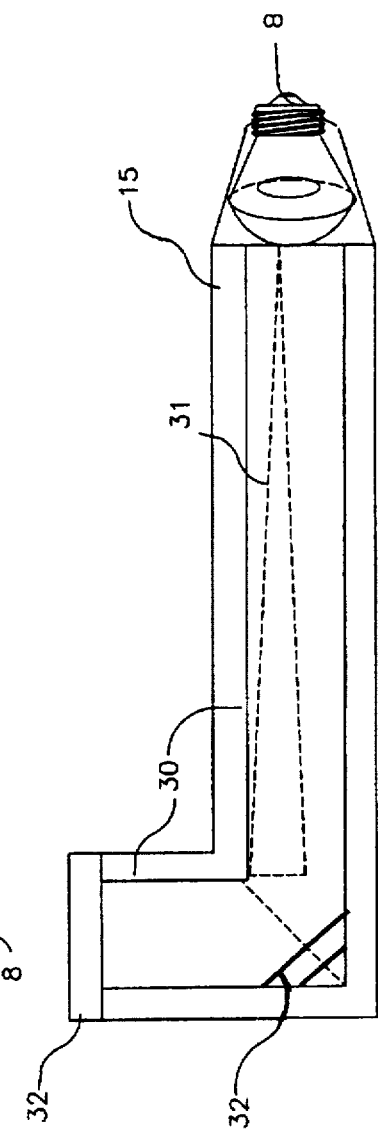

As shown by FIG. 6a and 6b, either end of light pipe 15 that does not have a light fixture 8 must include reflective surface material means or end cap, preferably a mirror 32. Alternatively, an additional light fixture 8 that includes conventional bulbs or Power Saver Bulb 61 (defined later) and ordinary reflector may be attached at either end, or the center of light pipe 15 connected by customary coupling or screw 26 means.

FIG. 6a shows one end, and FIG. 6b shows a cross-sectional side view of one of many possible configurations and embodiments of the present invention, where light fixture 8 is a spot light fixture with its customary reflector, and is attached to one end of light pipe 15 by ordinary clamping or screw means. A mirror-like reflective surface, or preferably mirror 32 is attached at the other end. The joined sections of light pipe 15, if required for the application, are connected by ordinary coupling and/or adhesive means. The reflective surface mirror 32 or alternatively right-angle prism, is positioned inside coupler 13 that joins vertical and horizontal sections of light pipes 15 together, so that light is reflected into the other sections. The amount of light emission from the transparent section of light pipe 15 is controlled by a 3M light extractor film 31 or any similar reflective material, which is attached by adhesive means, to predetermined parts of the inside wall surface of light pipe 15.

Figure 7:
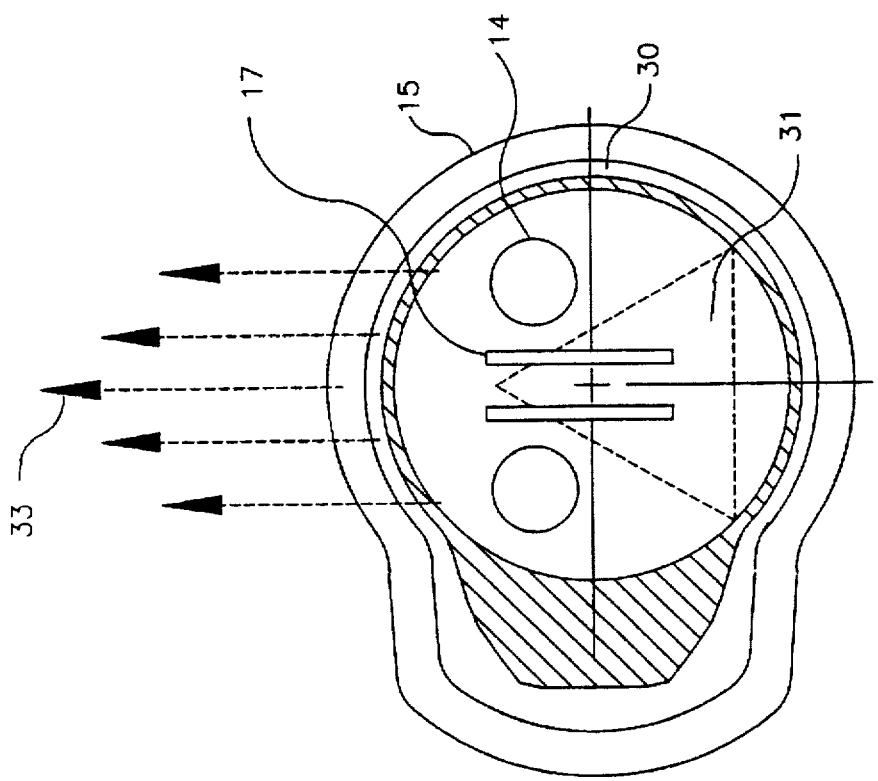
FIG. 7 shows a cross sectional, inside view of the transparent part of the light pipe where the interior surfaces are lined with 3M Optical Lighting Film, and one or more light bulbs are included, photovoltaic cells are attached inside, and 3M Light Extractor Film is attached inside part of the light pipe inside surface.

FIG. 7 shows the inside, cross sectional view of the transparent part of light pipe 15 where all interior surface walls are of a highly-polished metal material, or preferably lined with 3M optical lighting film material 30. The conventional light fixture 8 and bulb, such as a GE Biax bulb, among other possible choices, are centrally positioned inside, and photovoltaic cells 17 mounted on substrate 25 (FIG. 5) are also positioned centrally. 3M light extractor film 31 is attached to a predetermined part of the inside wall of light pipe 15 usually forming about a triangular-like shape, among other possible shapes, from light fixture 8, thereby causing reflected light beams 33 to egress from the opposite side walls of the transparent section of light pipe 15.3M light extractor film 31 can be cut into any desired shape and size, thereby controlling the quantity and direction of the light emissions from transparent sections of light pipe 15. The transparent section of light pipe 15 where part of the light egresses, may alternatively include conventional light diffusion means, such as diffraction grating plastic film, if required for the lighting application, attached inside the light pipe 15 wall, in any predetermined surface area.

Figure 8A:
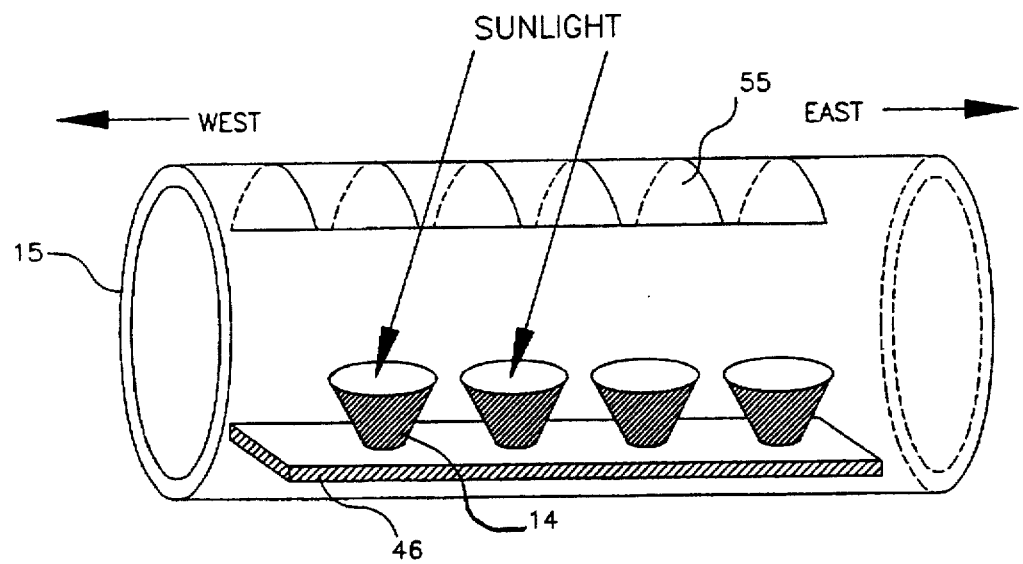
FIGS. 8a–8c show multiple views of the Solar Bulb embodiment of the current invention, where reflection, concentration, and conversion of solar energy is illustrated.
Figure 8B:
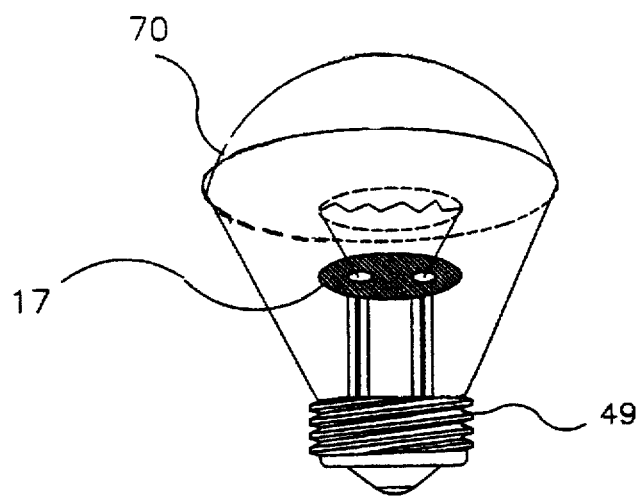

As depicted by FIG. 8b, in another embodiment and novel component of the current invention, the light fixture 8 is Solar Bulb 14 (Trade Mark). Solar Bulb 14 is partly similar in concept, but very different in implementation, to that disclosed by Manelas, in U.S. Pat. No. 4,080,221, the disclosure of which is hereby incorporated by reference. Manelas proposed an array of truncated conical light-collector shells, each made of preferably heat conducting aluminum, with a mirror-like, high-polish finish on the inner surface of the truncated conical side wall of the shell, whereby sunlight is collected in the larger opening of the shell and reflected from the polished surface down through the smaller opening of the shell, to the photovoltaic cells it encircles. However, to eliminate the excessive heat and utilize the solar energy absorbed by the heat conductive, truncated conical light-collector shells, a complex system was required including water tank, thermal valves, water pipes, etc.; therefore, cost justification for the overall performance achieved remained elusive, and overall system complexity and reliability is an important concern.

FIG. 8b illustrates a side view of the Solar Bulb 14 embodiment of the current invention, that converts any light source of sufficient spectral quality and intensity to electric energy. Light enters the top of ordinary reflector type lamp bulb glass housing, which includes a conventional removable transparent glass lens at the top, or preferably a novel reflector lens 70 of the current invention. Novel reflector lens 70 also has a substantially concave-like shaped reflector inside surface area, similar to that illustrated by reflector 22 (FIG. 2) inside dome 11, in miniature structure or configuration. The reflector part of novel reflector lens 70 preferably comprises the same highly-reflective metalized coating material as the reflector bulb housing, thereby reflecting sunlight from different positions of the sun, into Solar Bulb 14 glass housing, onto photovoltaic cell wafer 17 positioned inside. Solar Bulb 14 further includes an electric conductor base 49 selected from the group comprising of bayonet, bipost, sleeve, bipin, mogul, or preferably an ordinary screw type base 49 at the bottom. Solar Bulb 14 further includes a single or plurality of ordinary photovoltaic cell 17 wafers comprising round, oval, square, rectangular, octagonal, or two half-circular shaped wafers, of flat thin disc configuration, comprising semicrystalline, polycrystalline, or amorphous silicon solar cells. Photovoltaic cell wafers 17 of predetermined size, are positioned at the bottom, approximately centered, and substantially parallel to the top lens or novel reflector lens 70 of Solar Bulb 14. For example, the reflector type Solar Bulb 14 may include ordinary General Electric PAR-38 or R-40 or R-57, or special truck lamp bulb types, shapes and sizes, without any internal filaments, among other similar type, shape and size bulbs, where the top lens can be temporarily separated from the glass housing, so that photovoltaic cell wafers 17 can be inserted inside, and attached by silicone or other heat-tolerant adhesive means.

FIG. 8b further shows that the pair of DC electric output wires from photovoltaic cell wafers 17 are internally electrically attached, preferably by solder means, to the positive and negative conductors of Solar bulb 14 bottom base 49. The ordinary lens or novel transparent lens 70 is preferably hermetically sealed, or sealed by epoxy or silicon type adhesive to the top of Solar Bulb 14 glass housing, to protect photovoltaic cell 17 wafers from moisture and dust. A light focusing lens may alternatively be substituted for Solar bulb 14 novel transparent lens 70 at the top.

As shown by FIG. 8a, one or more Solar Bulbs 14 are attached to one or more conventional lamp bulb receptacles or sockets (not shown), that are mounted in a base housing 46 such as a conventional track lighting strip, among other possibilities, having a rigid planar bottom, side walls, and predetermined shape, comprising heat reflecting metal or plastic materials, such as typically supplied by electrical stores. A pair of DC output electric wires 53 (FIG. 8c) from all the outputs of the plurality of photovoltaic cells 17, are electrically attached in parallel, to the conventional lamp bulb sockets, and egresses from a base housing 46 (FIG. 8a), thereby providing a quantity of DC electric energy sufficient to operate electric devices. The pair of DC output electric wires 53 from base housing 46 is also inserted inside a conventional protective metal conduit jacket, and is electrically grounded to prevent shock and damage by lightning.

Other Solar Bulb 14 structures are possible, such as octagonal and round shaped structures. In the octagonal shape example, as illustrated by FIG. 9b, the top opening is about twice the size of the bottom base size, and the height is about equal to the bottom base size; thus the side walls of Solar Bulb 14 housing form an octagonal funnel-like structure. All inside walls of the bulb housing comprise a highly reflective material, such as mirror-like polished metal coating, or are covered with 3M optical lighting film, attached by heat resistant adhesive. The top opening of the octagonal shaped Solar Bulb 14 need only be covered with a transparent glass lens, if no other protective means is provided for Solar Bulb 14. In the latter case, the transparent glass lens is attached by epoxy or silicone adhesive. The DC electric outputs from each of the photovoltaic cells 17 are electrically connected to each other, in series or in parallel, and the DC output wires 53 from the plurality of photovoltaic cells 17 inside the plurality of Solar Bulbs 14 are thereafter electrically connected in parallel, thereby providing sufficient electric power for DC electric applications.

The advantage of octagonal shaped Solar Bulb 14 structure, as shown by FIG. 9c, is that differently shaped arrays of photovoltaic cells 17 from multiple suppliers, such as Solarex, Uni-Solar, Seimens, among other suppliers, can be easily accommodated, and more tightly packaged together, as illustrated, thereby producing greater DC electric power from the "beehive" like configuration. In addition, beehive packaging structure, as depicted, requires less area, thereby providing more electric power per square foot..

A round, cone shaped, reflector Solar Bulb 14 (FIG. 8b) however, is more efficient in concentrating light energy onto photovoltaic cells 17 inside the bulb housing, if the photovoltaic cell wafers 17 are also round. In that case, as illustrated by FIG. 9d, an extra large metal "muffin pan" used by ordinary bakers, that includes a plurality of muffin vessels or containers, has about the appropriate shape and configuration for the plurality of round photovoltaic cell wafers 17 to be inserted at the bottom of the muffin pan shaped base housing 46.

Larger muffin pans can be economically manufactured by stamping them out of thin metal sheeting, such as highly-polished, reflective aluminum. The bottom base surface of the plurality of separated muffin slots or containers should each be of equal predetermined diameter, the top opening should be about twice the diameter of the bottom diameter, and the height should be about equal to that of the bottom diameter, thus forming a plurality of separate conical-like reflector shells or containers. The inside surfaces of muffin pan base housing 46 are preferably coated or electroplated with highly-reflective metal material, to provide interior reflective surfaces. Thereafter, muffin pan base housing 46 is sealed with glass transparent lens 70 by silicone or epoxy sealant means, after photovoltaic cell wafers 17 are each inserted in the bottom base of each conical-like slot or container. An insulated hole is provided at the bottom base of muffin pan base housing 46 for DC output electric wires 53 from the plurality of photovoltaic cell wafers 17 contained inside to egress, and be electrically connected to each other in series and/or in parallel. Thus, this embodiment of the current invention provides a substantially lower cost, light weight, protective housing for a plurality of Solar Bulbs 14. Instead of baking muffins from dough, it makes electricity from light.

A single or plurality of the novel Solar Bulbs 14 may be installed on any exterior or interior surface area, wherever sufficient light energy exists, to generate additional electric power, such as on top of utility electric poles, on any building surface, on ship surfaces, inside sports facilities, inside brightly lighted tunnels, among many other possibilities. Each Solar Bulb 14 currently produces about two to five watts of electric power, depending on bulb size, number, and type of photovoltaic wafers used and their sizes, and the total light intensity and quality (solar or artificial) in any particular area.

Whenever additional protection of Solar Bulbs 14 from the weather and the environment is required, a plurality of Solar Bulbs 14 (FIG. 8a and FIG. 8c), configured as one or more rows, or in circular-like groupings, alternatively includes a protective, transparent housing, comprising light pipe 15 (FIG. 8a), or preferably D-shaped shaped transparent hollow conduit 52 (FIG. 8c), or dome 11 covering, as previously illustrated and defined by FIG. 2. The protective cover, such as the D-shaped shaped transparent hollow conduit 52 (FIG. 8c), or dome 11 comprises clear acrylic, polycarbonate, tempered-glass material, or Perspex, of at least 1/16 inch thickness, and may be of any predetermined size to accommodate the plurality of Solar Bulbs 14 included inside the protective cover.

Figure 8C:
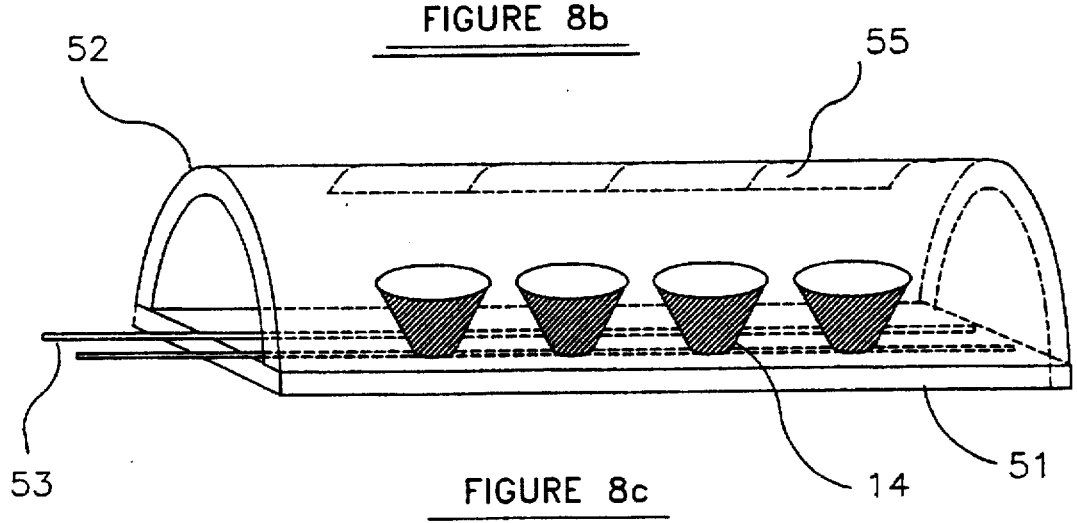

As illustrated by FIGS. 8a and 8c, respectively, sunlight enters the top of the protective, transparent light pipe 15 or preferably D-shaped transparent hollow tubular conduit 52 (FIG. 8c), that further includes inside its surface area, substantially concave reflector 55 means, comprising 3M Optical Lighting Film material, attached by adhesive means, forming reflective trough-like reflector 55. The additional object of this embodiment of the current invention, as depicted, includes maximizing the quantity of sunlight impinging on photovoltaic cell wafers 17 (FIG. 8b), at different angular positions of the sun, without any need for mechanical positioning, thus producing additional electric power from the photovoltaics cells 17, while also minimizing unwanted heat, and thereby providing substantial economic benefits.

FIGS. 10a, b, c, show other views of the embodiment of the present invention, where a plurality of Solar Bulbs 14 are enclosed in a protective transparent light pipe 15 that includes inside, parabolic-like trough reflector 55 of 3M optical lighting film material, whereby sunlight is reflected into Solar Bulbs 14 and thereafter onto the flat thin disc wafers of photovoltaic cells 17 inside, thereby producing substantial electric power.

As FIG. 10c further illustrates, one or more transparent light pipes 15 that house a plurality of Solar Bulbs 14 can also be configured as rows of light pipes 15 on any exterior surface area, where end sections face east and west, respectively, and the transparent side of light pipe 15 faces south, thereby providing a substantial quantity of light, and thus producing sufficient electric power required for the application. Without any protective housing and reflector, or novel reflector lens 70, Solar Bulbs 14 attached to their housing base 46 should be positioned at an angle of about forty five degrees from the horizontal plane on the rigid surface structure, facing approximately south when attached to any exterior surface or roof. The specific angle of inclination naturally will depend on the geographical location.

Figure 9A:
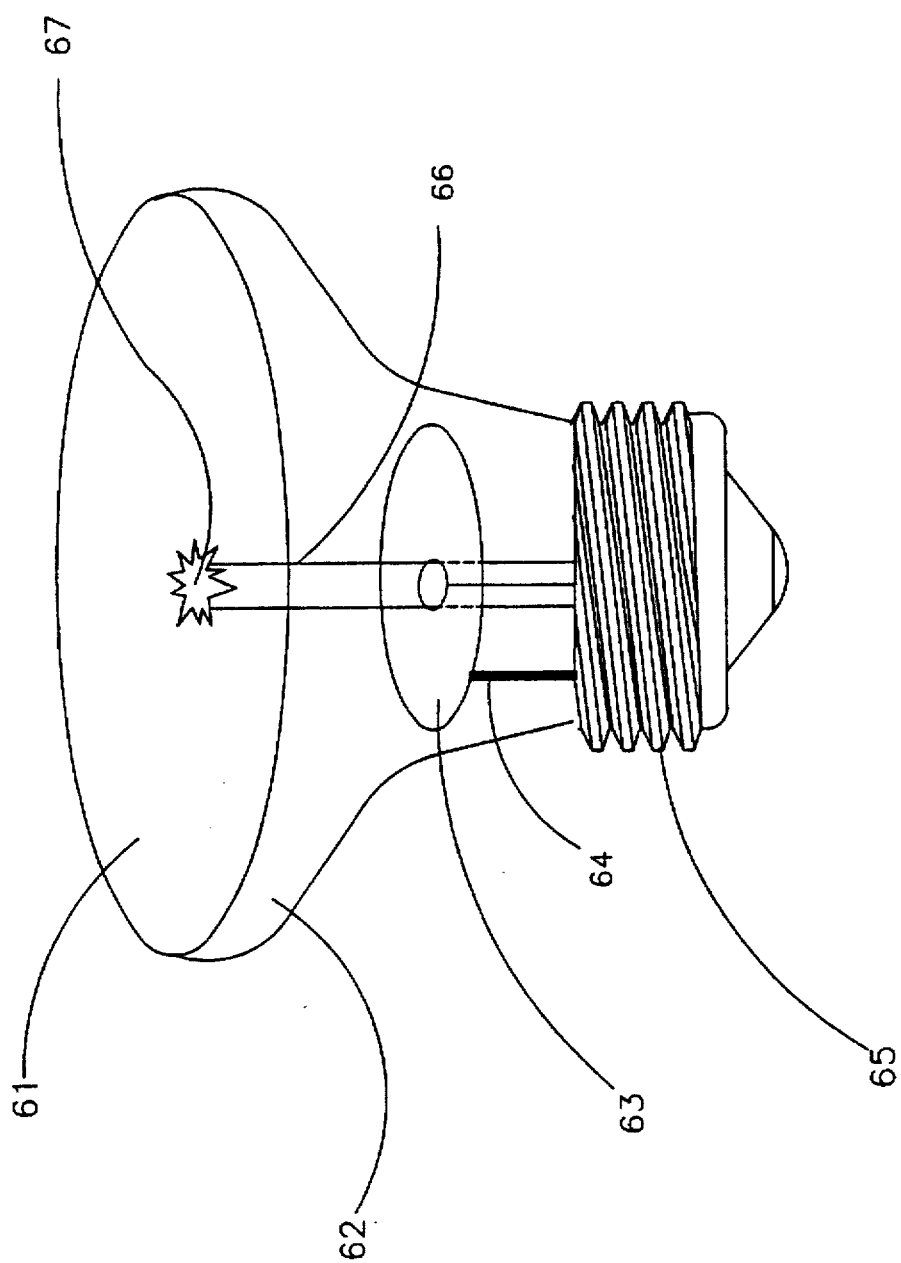
FIG. 9a shows the Power Saver Bulb embodiment of the present invention, where artificial light bulb filaments are included.

FIG. 9a illustrates a Power Saver Bulb 61 embodiment of the present invention, that is similar in concept and structure to Solar Bulb 14 as previously described, except that a reflector light bulb housing 61 includes a filament 67. The conventional filament 67 is normally positioned about in the center, and photovoltaic cells 17 configured as round thin wafer 63 or two half-circular wafers, are positioned inside Power Saver Bulb 61 about one inch below filament 67. This novel positioning of wafer 63 avoids substantially blocking light emissions from Power Saver Bulb 61 and reduces the amount of heat on a wafer 63. A pair of conducting wires 66 for filament 67 which extend through insulated hole (not shown) in round thin wafer 63 are internally electrically attached to a bulb base 65. However, if preferably two half-circular wafers 63 are used, no insulated hole need be made in wafers 63.

Photovoltaic cell wafers 63 are attached inside the housing 62 of Power Saver Bulb 61 by silicone or other heat-tolerant adhesive means. The DC output wires 64 from photovoltaic cell wafers 63 are electrically connected by solder means, to separate parts of Power Saver Bulb 61 bulb base 65 that are electrically isolated from the AC electric conductor part of bulb base 65 by insulating material means. Power Saver Bulb 61 is mounted in a conventional lamp bulb receptacle or socket bulb base, whereby the lead wires are electrically connected to corresponding individual contacts in conventional socket base. Bulb base 65 includes a metal shell into which is formed threads, although any type of conventional bulb base may be used. When Power Saver Bulb 61 is lit, light reflects off the highly-reflective inside housing 62 surfaces to illuminate the area, and also onto photovoltaic cells 17 wafer 63 thereby producing substantial DC electric energy.

While the above Power Saver Bulb 61 embodiment of the current invention is conceptually similar to that cited in U.S. Pat. No. 4,918,357, the implementation of the present invention represents a substantial improvement because photovoltaic cell wafers 63 are positioned substantially below filament 67 instead of on the insides of the bulb glass; thereby avoiding light blockage, and substantially reducing heat on the wafers 63. Polycrystalline photovoltaic wafers 63, for example, can operate at a temperature of up to about 185 degrees Fahrenheit, at reduced performance, whereas the upper portion inside temperature of any conventional 100 watt bulb reaches about 180 degrees, and the bottom neck is only about 125 degrees. Thus, the improved embodiment of the current invention is not limited to low-powered (below 100 watts) incandescent bulbs. Also, the primary object of the cited patented invention is to provide a dual filament light bulb, for extending the life of bulbs, which is not the object of the present invention.

The total output electrical energy produced by the plurality of photovoltaic cells 17 in the light pipe system of the current invention is dependent on: the intensity and angle of the sunlight source on dome 11 and reflector 22, if required for the application; the intensity and angle of the artificial light emitted from light fixtures 8; the quantity, shape, diameter, and length of light pipes 15; the total amount of light emissions from any transparent sections of light pipes 15; and the photovoltaic cell array 17 type, quantity and positioning inside the light pipes 15. In summary, it is estimated that a small light pipe system, of about eight feet in length, could save approximately ten to fifteen percent of the electric power consumed by alternative lighting systems that have about the same quantity and quality of lighting.

Although the present invention has been described in conjunction with the foregoing specific embodiments, the preceding description is intended to be exemplary and should not be used to limit the scope of the invention, since many alternatives, variations and modifications are apparent to those skilled in the art. Those alternatives, variations and modifications are intended to fall within the spirit and scope of the appended claims.

What is claimed is:

1. A light pipe energy conversion system, comprising:

a light energy source;

a hollow tubular conduit having inner and outer surfaces;

a reflective means covering substantially all the conduit inner surfaces;

the light energy source being at least one selected from the group including: sunlight, metal halide, fluorescent, halogen, incandescent, mercury, sulfur, and sodium light energy sources;

said hollow tubular conduit being selected from the group of shapes consisting of: round, square, teardrop, half moon, octagonal, hexagonal, and oval, of suitable diameter and length, and thickness of at least one sixteenth inch;

said hollow tubular conduit having a wall member of opaque, transparent, partly opaque, or partly transparent material selected from the group consisting of: tempered glass, acrylic, polycarbonate, plexiglas, aluminum, fiber, metal, and plastic;

means for attaching or otherwise coupling the light energy source to said hollow tubular conduit, whereby light is reflected therein and transported therefrom via said hollow tubular conduit; and further including an array of photovoltaic cells;

said photovoltaic cells being selected from the group consisting of: semicrystalline, polycrystalline, and amorphous silicon cells, and cells of the type disclosed by Alvin M. Marks in U.S. Pat. Nos. 4,574,161 and 5,229,624;

means for mounting said photovoltaic cell array inside the tubular conduit;

means for electrically connecting said photovoltaic cells to each other to form said array; and means for electrically connecting the DC output of said photovoltaic array to at least one electrical device for operation thereof.

2. The light pipe energy conversion system, as defined in claim 1, further including:

a plurality of light energy sources;

a plurality of hollow tubular conduits;

a plurality of photovoltaic cell arrays;

means for attaching the hollow tubular conduits to each other;

means for electrically connecting the plurality of photovoltaic cell arrays to each other;

means for attaching the light energy sources to the hollow tubular conduits;

whereby light is reflected therein and transported therefrom via said hollow tubular conduits.

3. The light pipe energy conversion system, as defined in claim 2, further including:

a transparent protective dome housing means;

a light concentrator means;

wherein the dome further includes a substantially concave reflective material means; and the light concentrator inside surfaces further include a reflective material means;

means for connecting said transparent protective dome housing and said light concentrator together;

means for connecting said the light concentrator housing to a vertical end of said hollow tubular conduit, thereby reflecting and concentrating the light energy incident thereon into said hollow tubular conduits and onto the photovoltaic cell arrays;

means for connecting said light concentrator and the vertical end of said hollow tubular conduits to an exterior roof surface cavity, so that the outer side of the dome approximately faces south, whereby sunlight radiates inside the tubular conduits.

4. The light pipe energy conversion system, as defined in claim 1, further including:

a rechargeable battery of predetermined size and power;

a charge controller of predetermined size and power, for controlling charging of the battery and preventing direct current from draining back into said array of photovoltaic cells when the light energy source is off;

means for electrically connecting said charge controller to said rechargeable battery; and means for electrically connecting said rechargeable battery to electrical devices, thereby for their operation.

5. The light pipe energy conversion system, as defined in claim 4, further including: a plurality of rechargeable batteries of predetermined size and power;

a charge controller of predetermined size and power for controlling charging of the batteries and preventing direct current from draining back into said array of photovoltaic cells, when the light energy source is off;

means for electrically connecting said charge controller to the batteries;

means for electrically connecting said batteries to electrical devices, thereby for their operation.

6. The light pipe energy conversion system, as defined in claim 5, further including:

a light bulb fixture and reflector or a mirror like reflective surface; wherein the light bulb fixture is selected from the group consisting of: metal halide, fluorescent, halogen, incandescent, mercury, sulfur, sodium, and solar bulb fixtures;

means for attaching said light bulb fixture and reflector, or mirror like reflective surface to either end or the center of said hollow tubular conduit;

a dc to ac inverter of predetermined size and power for converting dc to ac;

means for electrically connecting the dc to ac inverter to the light bulb fixture;

means for electrically connecting said rechargeable batteries to said inverter;

means for electrically connecting said inverter to electrical devices for their operation.

7. The light pipe energy conversion system, as defined in claim 6, further including:

an ac-dc light ballast with battery charge switch;

means for electrically connecting said rechargeable storage batteries to the light ballast battery charge switch;

means for electrically connecting said inverter to said light ballast battery charge switch;

means for electrically connecting said ac-dc light ballast to electrical receptacle contacts of said light bulb fixture thereby for its operation.

8. A solar bulb that converts light to electric energy, comprising:

a light bulb housing, without any filaments;

the light bulb housing including a reflector lens or a focusing lens;

means for attaching the lens on top of said light bulb housing;

said light bulb housing further including a light bulb base means;

said light bulb housing further including an array of photovoltaic cells;

means for positioning the array of photovoltaic cells inside said light bulb housing;

means for electrically connecting dc output wires from said array of photovoltaic cells to separate electrical contacts inside said light bulb base;

means for connecting the light bulb base to light bulb sockets, whereby dc electric energy is produced to operate electric devices;

further comprising:

a light bulb filament within said light bulb housing;

means for positioning said array of photovoltaic cells below the filament;

means for electrically insulating the electric wires of said light bulb filament from said array of photovoltaic cells;

a light bulb socket, containing separate AC and DC electrical contacts;

a light bulb base means adapted to be mounted in and receive AC power from said light bulb socket, containing separate AC and DC electrical contacts corresponding to the separate AC and DC electrical contacts of said light bulb socket; whereby sufficient AC electric energy causes said light bulb filament to illuminate, and DC electric energy is produced by said array of photovoltaic devices to operate other electric devices;

further comprising:

a plurality of said solar bulbs; a hollow tubular conduit protective housing means;

the hollow tubular conduit having an inner surface and outer surface selected from the group consisting of: round, square, teardrop, half moon, octagonal, and oval cross-sectional shapes, with a thickness of at least one sixteenth inch, and of width and predetermined length sufficient to hold said plurality of solar bulbs;

said hollow tubular conduit protective housing having a wall member of transparent material, selected from the group consisting of: tempered glass, acrylic, polycarbonate, plexiglas, and plastic;

a plurality of solar bulb sockets; and a light bulb socket of type, shape, and size to contain the plurality of solar bulb sockets.

9. The solar bulb, as set forth in claim 8, wherein:

said hollow tubular conduit protective housing further includes inside a light reflecting material means;

means for attaching the reflecting material inside said hollow tubular conduit protective housing, thereby forming a substantially parabolic reflector trough or a substantially concave reflective surface within said hollow tubular conduit protective housing;

means for inserting said plurality of solar bulbs inside said plurality of light bulb sockets;

means for electrically connecting said plurality of light bulb sockets to each other;

means for electrically connecting electric output wires from said plurality of light bulb sockets to electric devices, thereby for their operation;

means for positioning said light bulb socket base inside said hollow tubular conduit protective housing;

means for sealing said hollow tubular conduit protective housing; and means for connecting said hollow tubular conduit protective housing to an exterior surface, positioned so that said hollow tubular conduit protective housing transparent side faces approximately south, so that sunlight radiates inside said hollow tubular conduit protective housing, and due to said light reflecting material means, thereby impinging on said solar bulbs, while providing protection from adverse weather.

10. The solar bulb, as set forth in claim 8, further comprising:

a plurality of said solar bulbs;

a transparent dome housing;

the dome housing having predetermined thickness, diameter and height required to hold said plurality of the solar bulbs inside said transparent dome housing;

said transparent dome housing having a wall member of transparent material selected from the group consisting of: tempered glass, acrylic, polycarbonate, plexiglas, and plastic;

a plurality of light bulb sockets;

a light bulb receptacle base of type, shape, and size to hold said plurality of solar bulbs;

said transparent dome housing further including inside a light reflecting material;

means for attaching the reflecting material inside said transparent dome housing, thereby forming substantially concave reflective surface within said transparent dome housing;

means for inserting said plurality of solar bulbs inside the light bulb sockets;

means for electrically connecting the plurality of light bulb sockets to each other;

means for electrically connecting the electric output from said plurality of light bulb sockets to electric devices, thereby for their operation;

means for connecting said light bulb socket base to said transparent dome housing;

means for sealing said transparent dome housing;

means for connecting said transparent dome housing to an exterior surface, positioned approximately facing south, so that sunlight radiates inside said transparent dome housing, and due to the reflective means, thereby impinges on said plurality of solar bulbs from any sun position.

11. A method of constructing a more efficient light pipe energy conversion system, comprising the steps of:

selecting a plurality of light energy sources of predetermined light intensity, quality, power, and size sufficient for a predetermined lighting application;

selecting light pipes comprising a plurality of hollow tubular conduits of predetermined material, shape, and size;

providing a reflective material covering all light pipe inside surfaces;

selecting an array of photovoltaic cells of predetermined type, power, and size;

electrically connecting said array of photovoltaic cells to each other, in series or in parallel, so as to provide a predetermined electric dc voltage and current;

mounting said photovoltaic cell arrays on substrates of predetermined type and size;

inserting the photovoltaic arrays mounted on substrates so as to be approximately centered inside the light pipes;

electrically connecting output wires from said photovoltaic cell arrays to at least one dc electrical device, thereby for their operation.

12. A method of constructing a more efficient light pipe energy conversion system, as set forth in claim 11, further comprising the steps of:

selecting a rechargeable battery or batteries of predetermined size and power;

selecting a charge controller of predetermined size and power;

electrically connecting said charge controller to said rechargeable battery or batteries;

electrically connecting said rechargeable battery to at least one dc electrical device, thereby for their operation.

13. A method of constructing a more efficient light pipe energy conversion system, as set forth in claim 12, further comprising the steps of:

attaching a light bulb fixture to either end or the center of the light pipes;

providing a mirror at either end of said light pipes, as predetermined;

attaching a mirror or prism inside any couplers that connect any predetermined light pipe vertical and horizontal sections to each other;

connecting all the light pipes to each other by coupler attachment means;

sealing the end sections and any connections of said light pipes;

selecting a dc to ac inverter, of predetermined type, size, and power;

electrically connecting said rechargeable battery or batteries to the dc input of said inverter;

selecting a light ballast of a type that includes a battery charge switch;

electrically connecting said rechargeable battery or batteries to the light ballast dc input electric contacts of the battery charge switch;

electrically connecting the ac output of said inverter to said light ballast ac input of the battery charge switch;

electrically connecting output wires from said light ballast battery charge switch to electrical receptacle contacts of said light bulb fixture;

electrically connecting output wires from said inverter to electrical devices, thereby producing ac electricity for their operation.

* * * * *